United States Patent
Yamamoto et al.

(10) Patent No.: US 11,189,461 B2
(45) Date of Patent: Nov. 30, 2021

(54) SUBSTRATE PROCESSING METHOD AND APPARATUS

(71) Applicant: TOKYO ELECTRON LIMITED, Tokyo (JP)

(72) Inventors: Yoshinori Yamamoto, Tokyo (JP); Hideomi Hosaka, Yamanashi (JP); Naoki Takahashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/810,585

(22) Filed: Mar. 5, 2020

(65) Prior Publication Data

US 2020/0294767 A1 Sep. 17, 2020

(30) Foreign Application Priority Data

Mar. 14, 2019 (JP) .............................. JP2019-047212

(51) Int. Cl.
*H01J 37/32* (2006.01)
*C23C 14/54* (2006.01)
*C23C 14/34* (2006.01)
*H01J 37/34* (2006.01)

(52) U.S. Cl.
CPC .... *H01J 37/32027* (2013.01); *C23C 14/3485* (2013.01); *C23C 14/54* (2013.01); *H01J 37/32045* (2013.01); *H01J 37/3467* (2013.01)

(58) Field of Classification Search
CPC .............. C23C 14/165; C23C 14/3464; C23C 14/3485; C23C 14/54; H01J 37/32027; H01J 37/32045; H01J 37/32935; H01J 37/34; H01J 37/3467
USPC .................................................... 204/298.08
See application file for complete search history.

(56) References Cited

FOREIGN PATENT DOCUMENTS

JP 2010-116578 A 5/2010

*Primary Examiner* — Rodney G McDonald
(74) *Attorney, Agent, or Firm* — Fenwick & West LLP

(57) ABSTRACT

A substrate processing apparatus for performing a predetermined processing on a substrate includes a power supply device configured to supply a DC power. The power supply device includes a power supply and a current detection unit configured to detect a current value of a DC power from the power supply. The current detection unit includes a plurality of current sensors used for detecting the current value in the current detection unit and having different detection ranges for the current value, and a switching unit configured to switch the current sensors. The power supply is controlled such that the DC power from the power supply is maintained at a set value based on a detection result of the current detection unit, and the switching unit switches the current sensors depending on the set value of the DC power from the power supply.

12 Claims, 2 Drawing Sheets

SUBSTRATE PROCESSING METHOD AND APPARATUS

CROSS-REFERENCE TO RELATED APPLICATION

This application claims priority to Japanese Patent Application No. 2019-047212, filed on Mar. 14, 2019, the entire contents of which are incorporated herein by reference.

TECHNICAL FIELD

The present disclosure relates to a substrate processing method and apparatus.

BACKGROUND

Japanese Patent Application Publication No. 2010-116578 discloses a sputtering apparatus that includes a power supply device for supplying a DC pulse power to a plurality of sputtering evaporation sources and performs a film forming process by pulsed DC sputtering on a surface of a film forming target. In the sputtering apparatus, the power supply device includes one DC power supply, a power storage unit for storing a power from the DC power supply, and a pulse distribution supply unit for distributing and supplying the power stored in the power storage unit to each of the sputtering evaporation sources. The power supply device further includes a current sensor for each of the sputtering evaporation sources. Each current sensor is configured to measure a current flowing through the corresponding sputtering evaporation source. Further, targets that are attached to the sputtering evaporation sources are of the same type, and a Hall Effect current sensor capable of measuring a large current is used for the current sensor.

The present disclosure provides a substrate processing method and apparatus capable of obtaining high output accuracy over the entire output range of a DC power required for substrate processing.

SUMMARY

In accordance with an aspect of the present disclosure, there is provided a substrate processing apparatus for performing a predetermined processing on a substrate, including a power supply device configured to supply a DC power. The power supply device includes a power supply; and a current detection unit configured to detect a current value of a DC power from the power supply. The current detection unit includes a plurality of current sensors used for detecting the current value in the current detection unit and having different detection ranges for the current value; and a switching unit configured to switch the current sensors. The power supply is controlled such that the DC power from the power supply is maintained at a set value based on a detection result of the current detection unit, and the switching unit switches the current sensors depending on the set value of the DC power from the power supply.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
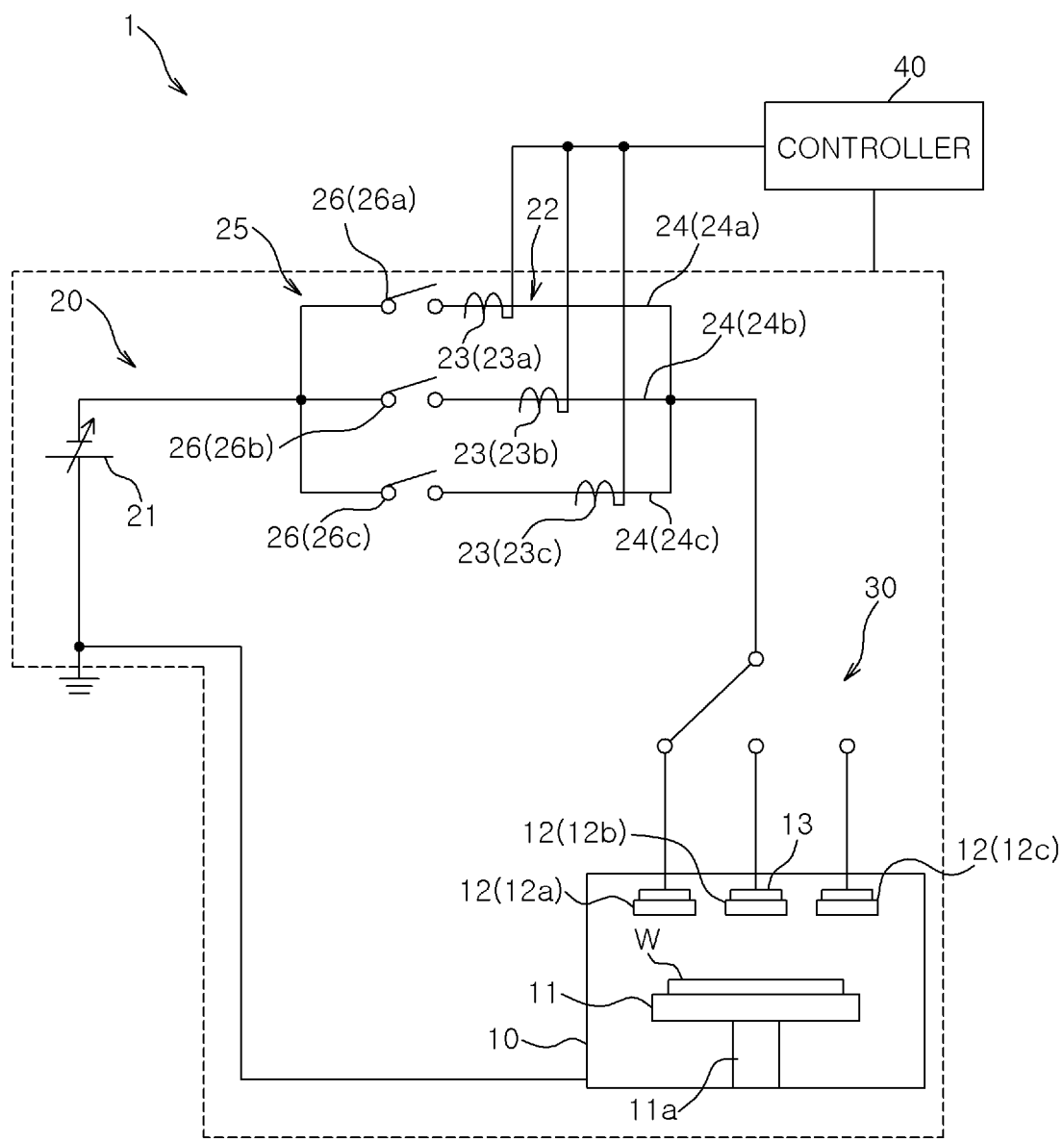
FIG. 1 schematically shows a configuration of a film forming apparatus serving as a substrate processing apparatus according to a first embodiment.

In manufacturing semiconductor devices, various processings including, e.g., a film forming process for forming a predetermined film such as a metal film, are repeatedly performed on a semiconductor wafer (hereinafter, referred to as "wafer") serving as a substrate. The film forming process may be performed through sputtering. In sputtering, a film forming material is set as a target, ions from plasma that is generated by exciting an argon gas or the like with DC power are collided with the target, and the film forming material that is set as the target is expelled in order to form a thin film on the wafer.

A film forming apparatus for performing the film forming process through sputtering may be provided with a plurality of targets. In this case, if the targets are of the same type, the magnitude of the DC power supplied to each target is the same. However, if the targets are of different types, the magnitude of the DC power supplied to each target is different.

In the conventional case, when it is necessary to supply different DC powers to the respective targets, a power supply is required for each target. However, the conventional case is not preferable in consideration of the cost and the installation space. Alternatively, when it is necessary to supply different DC powers to the respective targets, the power supplies, the number of which (e.g., one) is smaller than the number of the targets, may be provided while power supply destinations are switched. In this case, the DC power from the power supply should have a wide output range from a low output to a high output. However, in the conventional case, generally one power supply is provided with one current sensor for measuring the current from the power supply to control the power supply. In the power control using the detection result of one current sensor, the output accuracy of the DC power varies between the high output and the low output, which makes it difficult to obtain high output accuracy over the entire output range of the DC power. This is because even if one current sensor can accurately detect a large current flowing at the time of high output, it is difficult to accurately detect a small current flowing at the time of low output according to the relationship between the detection range of the current value and the resolution (for example, it is difficult to accurately detect a current of 0.1 A with a resolution of a current sensor capable of detecting a current of up to 10 A).

The above-mentioned drawback of the difficulty to obtain the high output accuracy over the entire output range of the DC power is not limited to the case where there are a plurality of targets and also occurs in the case where a power from a low level to a high level is supplied to one target. Further, the above-described drawback is not limited to the case of performing the film forming process by sputtering, and also occurs in the case of performing other substrate processing in which a power from a low level to a high level needs to be supplied to a load.

In the film forming apparatus disclosed in Japanese Patent Application Publication No. 2010-116578, one power supply is provided for multiple sputtering evaporation sources, and the current sensors are provided for the sputtering evaporation sources, respectively. However, in the film forming apparatus disclosed in the publication, the targets of the same type are attached to the multiple sputtering evaporation sources, and all the current sensors are configured to measure a large current. Therefore, Japanese Patent Application Publication No. 2010-116578 does not disclose the above-described drawback or suggest the solutions to the above-described drawback.

Therefore, the present disclosure provides a substrate processing apparatus and method capable of obtaining the high output accuracy over the entire output range of a DC power required for substrate processing.

Hereinafter, a substrate processing apparatus and method according to the embodiments of the present disclosure will be described with reference to the accompanying drawings. Like reference numerals will be given to like parts having substantially the same functions throughout the specification and the drawings, and redundant description thereof will be omitted.

First Embodiment

FIG. 1 schematically shows a configuration of a film forming apparatus 1 as a substrate processing apparatus according to a first embodiment.

The film forming apparatus 1 shown in FIG. 1 is configured to perform a film forming process that is a substrate processing through sputtering, and includes a processing chamber 10 and a power supply device 20.

The processing chamber 10 is pressure-reducible and accommodates a wafer W. The processing chamber 10 is made of, e.g., aluminum, and is connected to a ground potential. A mounting table 11 for horizontally mounting thereon the wafer W is disposed in the processing chamber 10. A heater (not shown) for heating the wafer W is disposed in the mounting table 11. The mounting table 11 is supported by a rotatable shaft 11a.

Although it is not shown, the processing chamber 10 includes a gas supply mechanism for supplying a gas into the processing chamber 10 and a gas exhaust mechanism for reducing the pressure of the inside of the processing chamber 10.

In the processing chamber 10, a plurality of targets 12 (12a to 12c) is disposed above the mounting table 11. The target 12a is used for forming a tantalum (Ta) film. The target 12b is used for forming a ruthenium (Ru) film. The target 12c is used for forming a magnesium (Mg) film. These targets 12a to 12c are respectively held by metal holders 13 serving as cathode electrodes. The holders 13 are supported at a ceiling wall of the processing chamber 10 through insulating members (not shown). Although the three targets 12 are provided in this example, the number of the targets is not limited thereto and may be two or more.

The targets 12 are connected to the power supply device 20 through the holders 13 and a switching unit 30 for switching a power supply destination.

The power supply device 20 is configured to supply a DC power to the targets 12 through the holders 13 and the switching unit 30.

The switching unit 30 is controlled by a controller 40 to be described later and configured to switch the targets 12 to the selected target 12 to which the DC power from the power supply device 20 is to be supplied.

The power supply device 20 includes one power supply 21 that is a DC power supply whose output voltage is variable. Although only one power supply 21 is illustrated in this example, the number of the power supplies 21 is not limited thereto and may be smaller than the number of the targets 12.

The power supply device 20 further includes a detection unit (current detection unit) 22 disposed between the power supply 21 and the switching unit 30 to detect a current value of the DC power from the power supply 21.

The detection unit 22 includes a plurality of current sensors 23 (23a to 23c) having different detection ranges for the current value. The current sensors 23 include a high-power current sensor 23a, a medium-power current sensor 23b, and a low-power current sensor 23c. These current sensors 23a to 23c are connected in parallel. Specifically, the detection unit 22 includes a high-power current detection circuit 24a, a medium-power current detection circuit 24b, and a low-power current detection circuit 24c. The current detection circuits 24a to 24c are connected in parallel and respectively provided with the current sensors 23a to 23c. In one example, the high power is higher than or equal to 1000 W and lower than or equal to 1500 W; the medium power is higher than or equal to 600 W and lower than 1000 W; and the low power is lower than 600 W. The detection range of the high-power current sensor 23a is lower than or equal to 10 A; the detection range of the medium-power current sensor 23b is lower than or equal to 1 A; the detection range of the low-power current sensor 23c is lower than or equal to 100 mA. The detection result of the current sensor 23 is outputted to the controller 40 to be described later.

The detection unit 22 further includes a switching unit 25 for switching the current sensors 23 to the current sensor 23 selected to be used for detecting the current value of the DC power supplied from the power supply 21 in the detection unit 22.

The switching unit 25 includes switches 26 (26a to 26c) respectively provided for the current sensors 23 (23a to 23c). Specifically, the switching unit 25 includes the switch 26a disposed at the high-power current detection circuit 24a having the high-power current sensor 23a, the switch 26b disposed at the medium-power current detection circuit 24b having the medium-power current sensor 23b, and the switch 26c disposed at the low-power current detection circuit 24c having the low-power current sensor 23c.

The switches 26a to 26c are configured to electrically connect or disconnect each of the current sensors 23a to 23c to or from the power supply 21. The switches 26 are controlled by the controller 40 to be described later.

The film forming apparatus 1 further includes the controller 40.

The controller 40 is, e.g., a computer, and has a program storage unit (not shown). The program storage unit stores a program for controlling the operations of the switch 26, the switching unit 30, and the like to control the processing of the wafer W including the power supply control. The program may be stored in a computer-readable storage medium and installed in the controller 40 from the storage medium. A part of the program or the entire program may be realized by a dedicated hardware (circuit board).

In the film forming apparatus 1, the controller 40 is configured to control the power supply 21 based on the detection result of the detection unit 22 such that the DC power from the power supply 21 is maintained at a set value. For example, the controller 40 adjusts at least one of an output voltage and an output current based on the detection result of the detection unit 22 to thereby adjust the DC power to be outputted. Further, in the film forming apparatus 1, the controller 40 is further configured to perform switching control for switching the current sensors 23 to the current sensor 23 selected to be used for detecting the current value in the detection unit 22 depending on the set value. In order to perform the switching control, information in which the range of the set value of the DC power is correlated with the current sensor 23 that is used when the set value of the DC power is within the corresponding range is stored in a storage unit (not shown). Further, it may also be possible to store information for determining the current sensor 23 to be used for each target 12 and perform the switching control for switching the current sensors 23 to the current sensor 23 selected to be used in the detection unit 22 depending on the target 12 that is the power supply destination based on the stored information.

Next, the film forming processes performed by the film forming apparatus 1 will be described.

<Transfer>

First, the wafer W is loaded from a transfer chamber (not shown), maintained in a vacuum atmosphere and disposed adjacent to the processing chamber 10, into the processing chamber 10 whose inner pressure has been reduced to a predetermined pressure by a gas exhaust mechanism (not shown).

<Sputtering>

Next, a predetermined film is formed on the wafer W by sputtering. Specifically, the wafer W is rotated while being mounted on the mounting table 11 at a rotational speed of 30 rpm to 300 rpm. Ar gas, for example, is introduced into the processing chamber 10 from a gas supply mechanism (not shown) at a flow rate of, e.g., 10 sccm to 500 sccm.

The DC power is supplied from the power supply device 20 to one of the targets 12, which corresponds to the target film to be formed.

Specifically, in the case of forming the Ta film that is preferably formed at a high power, the switching unit 30 switches the destination of the DC power supply to the target 12a. At the same time, the switch 26a for the high-power current sensor 23a is switched on, and the power supply 21 is controlled based on the detection result of the high-power current sensor 23a. Accordingly, the DC power controlled to be maintained at a set value (e.g., 1200 W) is supplied to the target 12a.

In the case of forming the Ru film that is preferably formed at a medium power, the switching unit 30 switches the destination of the DC power supply to the target 12b. At the same time, the switch 26b for the medium-power current sensor 23b is switched on, and the power supply 21 is controlled based on the detection result of the medium-power current sensor 23b. Accordingly, the DC power controlled to be maintained at a set value (e.g., 800 W) is supplied to the target 12b.

In the case of forming the Mg film that is preferably formed at a low power, the switching unit 30 switches the destination of the DC power supply to the target 12c. At the same time, the switch 26c for the low-power current sensor 23c is switched on, and the power supply 21 is controlled based on the detection result of the low-power current sensor 23c. Accordingly, the DC power controlled to be maintained at a set value (e.g., 50 W) is supplied to the target 12c.

The power supply time is set such that a film with a thickness of 0.1 nm to 1 nm can be formed.

In sputtering, plasma is generated to be concentrated below each target 12. Due to the collision between positive ions in the generated plasma and each target 12, the constituent materials of each target 12 are expelled from the surface of the target 12 and deposited on the wafer W.

<Unloading>

After the sputtering is completed, the wafer W is unloaded from the processing chamber 10 to the transfer chamber (not shown) that is maintained in a vacuum atmosphere and disposed adjacent to the processing chamber 10.

In this manner, a series of the film forming processes is completed.

As described above, in the first embodiment, the film forming apparatus 1 includes the power supply device 20 for supplying a DC power, and the power supply device 20 includes the power supply 21 and the current detection unit 22 for detecting a current value of the DC power from the power supply 21. Further, in the first embodiment, the detection unit 22 includes the plurality of current sensors 23 used for detecting the current value of the DC power from the power supply 21 and having different detection ranges for the current value, and the switching unit 25 for switching the current sensors 23. In the first embodiment, the power supply 21 is controlled such that the DC power from the power supply 21 is maintained at the set value based on the detection result of the detection unit 22, and the switching unit 25 switches the current sensors 23 depending on the set value. Therefore, in the first embodiment, the current value of the DC power from the power supply 21 is detected by the current sensor 23 having the current detection range corresponding to the set value, and the DC power from the power supply 21 is controlled to be maintained at the set value based on the detection result. Accordingly, the DC power can be supplied to the target 12 with high output accuracy regardless of the magnitude of the set value. In other words, the high output accuracy can be obtained over the entire DC power output range (i.e., including the high power, the medium power, and the low power) required for the film forming process. For example, in accordance with the first embodiment, when the set value is within a range from 20 W to 50 W, the DC power can be supplied with an accuracy of ±0.5 W or less of the set value. When the set value is within a range from 50 W to 1500 W, the DC power can be supplied with an accuracy of ±1.0% or less of the set value.

Further, in the first embodiment, the number of the power supplies 21 is smaller than the number of the targets 12. Specifically, the number of the power supplies 21 is one. Therefore, it becomes possible to prevent the increase in the cost and the scaling up of the film forming apparatus 1.

Second Embodiment

Figure 2:
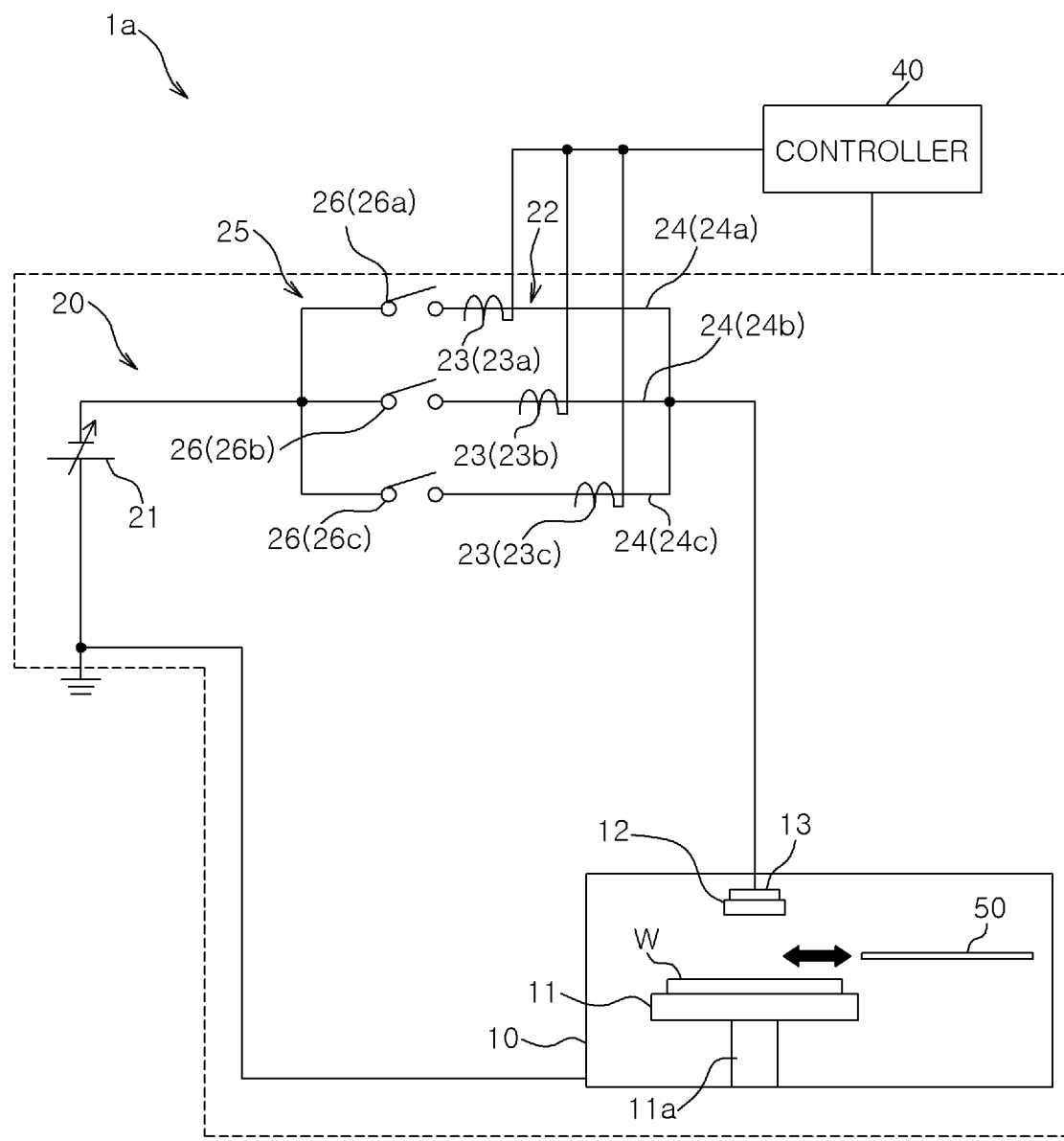
FIG. 2 schematically shows a configuration of a film forming apparatus serving as a substrate processing apparatus according to a second embodiment.

FIG. 2 schematically shows a configuration of a film forming apparatus 1a as a substrate processing apparatus according to a second embodiment.

In the first embodiment, the plurality of targets 12 are disposed in the processing chamber 10 of the film forming apparatus 1. However, in the second embodiment, one target 12 is disposed in the processing chamber 10 of the film forming apparatus 1a. In the second embodiment, a cover member 50 that moves toward or retreats from a position above the mounting table 11, i.e., the wafer W on the mounting table 11, is disposed in the processing chamber 10. In the second embodiment, the switching unit 30 for the power supply destination is omitted.

Next, the film forming process using the film forming apparatus 1a will be described.

<Transfer>

First, the wafer W is loaded from the transfer chamber (not shown), maintained in a vacuum atmosphere and disposed adjacent to the processing chamber 10, into the processing chamber 10 whose inner pressure has been reduced to a predetermined pressure by the gas exhaust mechanism (not shown). Then, the wafer W is mounted on the mounting table 11.

<Plasma Ignition>

Next, a plasma ignition process is performed. Specifically, the cover member 50 is moved to cover the upper surface of wafer W on the mounting table 11. Ar gas, for example, is introduced into the processing chamber 10 from a gas supply mechanism (not shown) at a flow rate of, e.g., 10 sccm to 500 sccm. The DC power from the power supply device 20 for the plasma ignition process is supplied to the target 12. Specifically, the switch 26a for the high-power current sensor 23a is switched on, and the power supply 21 is controlled based on the detection result of the high-power current sensor 23a. Accordingly, the DC power, which is controlled to be maintained at a set value (e.g., 1200 W) that is set for the plasma ignition process, is supplied to the target 12. The supply of the high DC power is continued until the ignited plasma becomes stable.

In the plasma ignition process, since the surface of the wafer W is covered by the cover member 50, it is possible to prevent the constituent materials of the target 12 expelled by positive ions in the plasma from being deposited on the wafer W.

<Film Formation>

After the plasma ignition process, a film is formed on the wafer W by sputtering. Specifically, the cover member 50 is retreated from the position of covering the upper surface of the wafer W. The wafer W is rotated by rotating the mounting table 11 at a rotation speed of 30 rpm to 300 rpm. After the plasma ignition process, Ar gas, for example, is introduced into the processing chamber 10 from the gas supply mechanism (not shown) at a flow rate of, e.g., 10 sccm to 500 sccm. Then, the DC power supplied to the target 12 is switched to a power lower than that in the plasma ignition process. Specifically, the set value of the DC power outputted from the power supply 21 is changed to a lower value (e.g., 200 W). At the same time, the switch 26c for the low-power current sensor 23c is switched on, and the DC power from the power supply 21 is controlled based on the detection result of the low-power current sensor 23c. Thereafter, the switch 26a for the high-power current sensor 23a is switched off. In other words, when switching the current sensors 23 used for detecting the current value in the detection unit 22, the switched low-power current sensor 23c and the power supply 21 are electrically connected first and, then, the electrical connection established before switching to the low-power current sensor 23c between the high-power current sensor 23a and the power supply 21 is disconnected.

The DC power supply time at a low power is set to allow a film with a thickness of 0.1 nm to 1 nm to be formed.

In the film forming process, plasma is generated to be concentrated below the target 12. Due to the collision between positive ions in the generated plasma and the target 12, the constituent materials of the target 12 are expelled from the surface of the target 12 and deposited on the wafer W.

In the second embodiment, the plasma may not be ignited if the DC power supplied to the target 12 in the plasma ignition process is lowered. Therefore, the DC power supplied to the target 12 is lowered only in the film forming process. A high-quality film can be obtained by lowering the DC power supplied to the target 12 in the film forming process.

<Unloading>

After the film forming process, the wafer W is unloaded from the processing chamber 10 to the transfer chamber (not shown) that is maintained in a vacuum atmosphere and disposed adjacent to the processing chamber 10.

In this manner, a series of film forming processes is completed.

As described above, in the second embodiment, when the current sensors 23 used in the detection unit 22 are switched due to the change of the set value of the DC power from the power supply, the switched current sensor 23 and the power supply 21 are electrically connected first and, then, the current sensor 23 that is previously connected to the power supply 21 before switching to the switched current sensor is disconnected from the power supply 21. Therefore, in accordance with the second embodiment, when the current sensors 23 are switched, it is possible to avoid a situation in which the current detection is not performed by any of the current sensors 23. Accordingly, the DC power outputted from the power supply 21, which is controlled based on the current detection result of the current sensor 23, is stable. Therefore, it is possible to prevent dissipation of the plasma due to an unstable DC power from the power supply 21.

Further, in accordance with the second embodiment, the supply of the DC power from the power supply 21 to the target 12 is not interrupted.

While the film forming apparatus for performing the film forming process by sputtering has been described as an example, the present disclosure may be applied to any substrate processing in which a power ranging from a low level to a high level needs to be supplied to a load, and high output accuracy of the DC power is required for detecting a current value. For example, the present disclosure may be applied to a substrate processing in which a bias voltage for plasma processing is applied to a mounting table on which a substrate is mounted, a substrate processing in which a DC power for temperature control is supplied to a heater disposed in a mounting table on which a substrate is mounted, or the like.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

The following configurations are included in the technical scope of the present disclosure.

There is a substrate processing apparatus for performing a predetermined processing on a substrate, including a power supply device configured to supply a DC power. The power supply device includes a power supply and a current detection unit configured to detect a current value of a DC power from the power supply. The current detection unit includes a plurality of current sensors used for detecting the current value in the current detection unit and having different detection ranges for the current value, and a switching unit configured to switch the current sensors. The power supply is controlled such that the DC power from the power supply is maintained at a set value based on a detection result of the current detection unit, and the switching unit switches the current sensors depending on the set value of the DC power from the power supply.

With such a configuration, the current value of the DC power from the power supply is detected by the current sensor having the current detection range corresponding to the set value, and the DC power from the power supply is controlled to be maintained at the set value based on the detection result of the current detection unit. Therefore, the power supply device can supply the DC power with high output accuracy regardless of the magnitude of the set value. Accordingly, the high output accuracy can be obtained over the entire output range of the DC power required for the substrate processing.

The substrate processing apparatus may further include a plurality of targets for sputtering, and the predetermined processing may be a film forming process performed by the sputtering. The set value of the DC power from the power supply may be set for each of the targets.

The substrate processing apparatus may further include a target for sputtering, and the predetermined processing is a film forming process performed by the sputtering. The set value of the DC power from the power supply may be changed after a predetermined time from when the film forming process performed by the sputtering is started.

In the substrate processing apparatus, the current sensors may be connected in parallel. Further, the switching unit may include switches that are respectively provided to the current sensors, and the switches may be configured to make an electrical connection or an electrical disconnection between the respective current sensors and the power supply.

The substrate processing apparatus may further include a controller configured to control the switches, when switching the current sensors used for detecting the current value in the current value detection unit, such that the switched current sensor and the power supply are electrically connected and, then, the current sensor that is previously connected to the power supply before switching to the switched current sensor is disconnected from the power supply.

With such configuration, when the current sensors are switched, it is possible to avoid a situation in which the current detection is not performed by any of the current sensors. Accordingly, the DC power outputted from the power supply, which is controlled based on the current detection result of the current sensor, is stable.

There is provided a substrate processing method for performing a predetermined processing on a substrate with a substrate processing apparatus including a power supply device configured to supply a DC power, the power supply device having a current detection unit configured to detect a current value of the DC power from a power supply and the current detection unit having a plurality of current sensors used for detecting the current value in the current detection unit and having different detection ranges for the current value. The substrate processing method includes a step of controlling the DC power from the power supply to be maintained at a set value based on a detection result of the current detection unit, and a step of switching the current sensors depending on the set value of the DC power from the power supply.

In the substrate processing method, the current sensors may be connected in parallel, and switches may be respectively provided to the current sensors to make an electrical connection or an electrical disconnection between the respective current sensors and the power supply. Further, the step of switching the current sensors may include controlling the switches such that the switched current sensor and the power supply are electrically connected and, then, the current sensor that is previously connected to the power supply before switching to the switched current sensor is disconnected from the power supply.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate processing apparatus for performing a predetermined processing on a substrate, comprising:
a power supply device configured to supply a DC power, wherein the power supply device includes:
a power supply; and
a current detection unit configured to detect a current value of a DC power from the power supply,
wherein the current detection unit includes:
a plurality of current sensors used for detecting the current value in the current detection unit and having different detection ranges for the current value; and
a switching unit configured to switch the current sensors,
wherein the power supply is controlled such that the DC power from the power supply is maintained at a set value based on a detection result of the current detection unit, and
the switching unit switches the current sensors depending on the set value of the DC power from the power supply.

2. The substrate processing apparatus of claim 1, further comprising:
a plurality of targets for sputtering,
wherein the predetermined processing is a film forming process performed by the sputtering, and
the set value of the DC power from the power supply is set for each of the targets.

3. The substrate processing apparatus of claim 1, further comprising:
a target for sputtering,
wherein the predetermined processing is a film forming process performed by the sputtering, and
the set value of the DC power from the power supply is changed after a predetermined time from when the film forming process performed by the sputtering is started.

4. The substrate processing apparatus of claim 1, wherein the current sensors are connected in parallel,
the switching unit includes switches that are respectively provided to the current sensors, and the switches are configured to make an electrical connection or an electrical disconnection between the respective current sensors and the power supply,
the substrate processing apparatus further comprises: a controller configured to control the switches, when switching to one of the current sensors used for detecting the current value in the current value detection unit, such that the one of the current sensors and the power supply are electrically connected and, then, the other current sensor that was previously connected to the power supply before switching to the one of the current sensors is disconnected from the power supply.

5. The substrate processing apparatus of claim 2, wherein the current sensors are connected in parallel,
the switching unit includes switches that are respectively provided to the current sensors, and the switches are configured to make an electrical connection or an electrical disconnection between the respective current sensors and the power supply,
the substrate processing apparatus further comprises: a controller configured to control the switches, when switching to one of the current sensors used for detecting the current value in the current value detection unit, such that the one of the current sensors and the power supply are electrically connected and, then, the other current sensor that was previously connected to the power supply before switching to the one of the current sensors is disconnected from the power supply.

6. The substrate processing apparatus of claim 3, wherein the current sensors are connected in parallel,
the switching unit includes switches that are respectively provided to the current sensors, and the switches are configured to make an electrical connection or an electrical disconnection between the respective current sensors and the power supply,
the substrate processing apparatus further comprises: a controller configured to control the switches, when switching to one of the current sensors used for detecting the current value in the current value detection unit, such that the one of the current sensors and the power supply are electrically connected and, then, the other current sensor that was previously connected to the power supply before switching to the one of the current sensors is disconnected from the power supply.

7. A substrate processing method for performing a predetermined processing on a substrate with a substrate processing apparatus,
wherein the substrate processing apparatus includes a power supply device configured to supply a DC power,
wherein the power supply device has a current detection unit configured to detect a current value of the DC power from a power supply,
wherein the current detection unit has a plurality of current sensors used for detecting the current value in the current detection unit and having different detection ranges for the current value,
the substrate processing method comprising:
controlling the DC power from the power supply to be maintained at a set value based on a detection result of the current detection unit;
switching the current sensors depending on the set value of the DC power from the power supply.

8. The substrate processing method of claim 7, wherein the substrate processing apparatus includes a plurality of targets for sputtering,
the predetermined processing is a film forming process performed by the sputtering, and
the set value of the DC power from the power supply is set for each of the targets.

9. The substrate processing method of claim 7, wherein the substrate processing apparatus has a target for sputtering,
the predetermined processing is a film forming process performed by the sputtering, and
the set value of the DC power from the power supply is changed after a predetermined time from when the film forming process performed by the sputtering is started.

10. The substrate processing method of claim 7, wherein the current sensors are connected in parallel, and switches are respectively provided to the current sensors to make an electrical connection or an electrical disconnection between the respective current sensors and the power supply, and
said switching the current sensors includes:
controlling the switches such that the one of the current sensors and the power supply are electrically connected and, then, the other current sensor that was previously connected to the power supply before switching to the one of the current sensors is disconnected from the power supply.

11. The substrate processing method of claim 8, wherein the current sensors are connected in parallel, and switches are respectively provided to the current sensors to make an electrical connection or an electrical disconnection between the respective current sensors and the power supply, and
said switching the current sensors includes:
controlling the switches such that the one of the current sensors and the power supply are electrically connected and, then, the other current sensor that was previously connected to the power supply before switching to the one of the current sensors is disconnected from the power supply.

12. The substrate processing method of claim 9, wherein the current sensors are connected in parallel, and switches are respectively provided to the current sensors to make an electrical connection or an electrical disconnection between the respective current sensors and the power supply, and
said switching the current sensors includes:
controlling the switches such that the one of the current sensors and the power supply are electrically connected and, then, the other current sensor that was previously connected to the power supply before switching to the one of the current sensors is disconnected from the power supply.

* * * * *